(12) United States Patent
Garcia (10) Patent No.: US 11,268,652 B2
(45) Date of Patent: Mar. 8, 2022

(54) APPARATUS AND SYSTEM FOR ATTACHING PANEL MOUNTED ELECTRICAL COMPONENTS

(71) Applicant: Rene Garcia, Miami, FL (US)

(72) Inventor: Rene Garcia, Miami, FL (US)

(*) Notice: Subject to any disclaimer, the term of this patent is extended or adjusted under 35 U.S.C. 154(b) by 0 days.

(21) Appl. No.: 16/865,506

(22) Filed: May 4, 2020

(65) Prior Publication Data

US 2021/0341096 A1 Nov. 4, 2021

(51) Int. Cl.
*F16M 13/02* (2006.01)
*H05K 7/14* (2006.01)
*H01H 13/02* (2006.01)

(52) U.S. Cl.
CPC .............. *F16M 13/02* (2013.01); *H05K 7/14* (2013.01); *H01H 13/02* (2013.01)

(58) Field of Classification Search
CPC ........... F16M 13/02; H05K 7/14; H01H 13/02
See application file for complete search history.

(56) References Cited

U.S. PATENT DOCUMENTS

| | | | | | |
|---|---|---|---|---|---|
| 3,251,333 | A | * | 5/1966 | Smenner | B63H 20/12 440/62 |
| 5,744,768 | A | * | 4/1998 | Bishop | H01H 71/0214 200/50.01 |
| 5,768,091 | A | * | 6/1998 | Vinson | H02B 1/052 200/293 |
| 5,794,395 | A | * | 8/1998 | Reed | E04F 11/1812 403/230 |
| 5,794,903 | A | * | 8/1998 | Peterson, II | A47B 97/00 248/300 |
| 6,250,041 | B1 | * | 6/2001 | Seccombe | E04B 1/2604 52/712 |
| 6,351,592 | B1 | * | 2/2002 | Ehn | G02B 6/4452 174/541 |
| 7,533,508 | B1 | * | 5/2009 | diGirolamo | E04B 2/58 248/300 |
| 8,254,089 | B2 | * | 8/2012 | Cosley | H02B 1/32 361/640 |
| 8,387,321 | B2 | * | 3/2013 | diGirolamo | E04B 2/58 52/242 |

(Continued)

FOREIGN PATENT DOCUMENTS

EP 3650279 A1 * 5/2020 ............. F16B 2/065

*Primary Examiner* — Eret C McNichols
(74) *Attorney, Agent, or Firm* — Mark Terry (57) ABSTRACT

An apparatus for attaching a panel mounted electrical component includes an L-shaped bracket. The bracket includes a horizontal member having a frontward facing edge and a rearward facing edge. The bracket further includes an opening on the horizontal member that is configured for receiving a panel mounted electrical component. A vertical member is aligned along the rearward facing edge of the horizontal member. The vertical member is integral with the horizontal member and defines a ninety-degree angle. A plurality of openings located on the vertical member are configured for receiving fasteners to attach an outward facing surface of the vertical member to a surface. The bracket also includes a lip that is vertically aligned along the frontward facing edge of the horizontal member. The lip is integral with the horizontal member and defines a ninety-degree angle.

8 Claims, 10 Drawing Sheets

(56) References Cited

U.S. PATENT DOCUMENTS

| | | | | |
|---|---|---|---|---|
| 8,555,592 | B2* | 10/2013 | Daudet | E04B 1/2403 |
| | | | | 52/489.1 |
| 8,979,043 | B2* | 3/2015 | Florman | F21V 21/00 |
| | | | | 248/200 |
| 9,004,778 | B2* | 4/2015 | Isenhour | G02B 6/3831 |
| | | | | 385/77 |
| 9,010,696 | B2* | 4/2015 | Siddiqui | F16L 3/24 |
| | | | | 248/65 |
| 9,761,383 | B2* | 9/2017 | Leach | H01H 9/02 |
| 9,938,709 | B2* | 4/2018 | Daudet | E04B 1/2403 |
| 10,087,617 | B2* | 10/2018 | Daudet | E04B 2/96 |
| 10,411,440 | B1* | 9/2019 | Robinson | H02B 1/0565 |
| 10,590,644 | B2* | 3/2020 | Naylor | E04B 1/66 |
| D894,721 | S * | 9/2020 | LePoire | D8/382 |
| 11,078,682 | B1* | 8/2021 | diGirolamo | E04B 1/2403 |
| 2003/0234619 | A1* | 12/2003 | Brunker | H05B 39/00 |
| | | | | 315/112 |
| 2005/0109596 | A1* | 5/2005 | Quintanilla | H01H 9/0264 |
| | | | | 200/293 |
| 2009/0173844 | A1* | 7/2009 | Huo | H02G 3/32 |
| | | | | 248/65 |
| 2014/0190109 | A1* | 7/2014 | Bergman | E04B 9/008 |
| | | | | 52/506.05 |
| 2015/0318123 | A1* | 11/2015 | Leach | H01H 9/28 |
| | | | | 200/50.35 |
| 2018/0062571 | A1* | 3/2018 | Ash | H01R 4/305 |
| 2018/0066425 | A1* | 3/2018 | Ralph | E04B 1/2403 |
| 2018/0135293 | A1* | 5/2018 | Daudet | E04B 2/96 |
| 2021/0210933 | A1* | 7/2021 | Dubrosky | H01H 71/0264 |

* cited by examiner

Fig. 10

APPARATUS AND SYSTEM FOR ATTACHING PANEL MOUNTED ELECTRICAL COMPONENTS

CROSS-REFERENCE TO RELATED APPLICATIONS

Not applicable.

STATEMENT REGARDING FEDERALLY SPONSORED RESEARCH OR DEVELOPMENT

Not applicable.

INCORPORATION BY REFERENCE OF MATERIAL SUBMITTED ON A COMPACT DISC

Not applicable.

TECHNICAL FIELD

The claimed embodiments relate to the field of mounting brackets for electrical power components, and more specifically to the field of brackets for attaching panel mounted electrical components to an external surface.

BACKGROUND

Electrical panels contain circuit breakers designed to trip and stop the flow of current to specific circuits and appliances. A circuit breaker is an automatically operated electrical switch designed to protect an electrical circuit from damage caused by excess current from an overload or short circuit. Its basic function is to interrupt current flow after a fault is detected. Contacts in a circuit breaker provide a method for connecting the circuit with the system. They also provide a method for isolating a part of a circuit from the rest of the system. A contact set contains a fixed and movable contact. As a circuit breaker opens or closes, the fixed contact maintains its position while the movable contact moves to close (make) or open (break) the circuit. When all is said and done, contacts perform a simple function; they open and close. Circuit breakers require some type of operating mechanism to open and close the contacts. This operating mechanism can be mechanical or a combination of mechanical and power.

Although circuit breakers should be capable of being reached quickly for operation, renewal, or inspections, many circuit breakers are located in inconvenient locations that require those to whom ready access is requisite to actions to use tools or remove obstacles. Therefore, a need exists to improve over the prior art and more particularly, an apparatus that allows a user to quickly and easily access a circuit breaker to repair, isolate or manipulate the wiring or electrical devices or appliances on that circuit.

SUMMARY

An apparatus and system for attaching panel mounted electrical components is disclosed. This Summary is provided to introduce a selection of disclosed concepts in a simplified form that are further described below in the Detailed Description including the drawings provided. This Summary is not intended to identify key features or essential features of the claimed subject matter. Nor is this Summary intended to be used to limit the claimed subject matter's scope.

In one embodiment, an apparatus for attaching a panel mounted electrical component is disclosed. The apparatus includes an L-shaped bracket. The bracket includes a horizontal member having a frontward facing edge and a rearward facing edge. The bracket further includes an opening on the horizontal member that is configured for receiving a panel mounted electrical component. A vertical member is aligned along the rearward facing edge of the horizontal member. The vertical member is integral with the horizontal member and defines a ninety-degree angle. A plurality of openings located on the vertical member are configured for receiving fasteners to attach an outward facing surface of the vertical member to a surface. The bracket also includes a lip that is vertically aligned along the frontward facing edge of the horizontal member. The lip is integral with the horizontal member and defines a ninety-degree angle.

In one embodiment, an apparatus for attaching panel mounted electrical components is disclosed. The apparatus includes an L-shaped bracket. The bracket includes a horizontal member having a frontward facing edge and a rearward facing edge. The bracket further includes a first opening on the horizontal member for receiving a first panel mounted electrical component and a second opening on the horizontal member for receiving a second panel mounted electrical component. A vertical member is aligned along the rearward facing edge of the horizontal member. The vertical member is integral with the horizontal member and defines a ninety-degree angle. A plurality of openings located on the vertical member are configured for receiving fasteners to attach an outward facing surface of the vertical member to a surface. The bracket also includes a lip that is vertically aligned along the frontward facing edge of the horizontal member. The lip is integral with the horizontal member and defines a ninety-degree angle.

In one embodiment, a system for attaching panel mounted electrical components to a surface is disclosed. The system includes an apparatus for attaching at least one panel mounted electrical component to an external surface and at least one panel mounted electrical component.

Additional aspects of the disclosed embodiment will be set forth in part in the description which follows, and in part will be obvious from the description, or may be learned by practice of the disclosed embodiments. The aspects of the disclosed embodiments will be realized and attained by means of the elements and combinations particularly pointed out in the appended claims. It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute part of this specification, illustrate embodiments and together with the description, serve to explain the principles of the disclosed embodiments. The embodiments illustrated herein are presently preferred, it being understood, however, that the claimed embodiments are not limited to the precise arrangements and instrumentalities shown, wherein:

DETAILED DESCRIPTION

The following detailed description refers to the accompanying drawings. Whenever possible, the same reference numbers are used in the drawings and the following description to refer to the same or similar elements. While disclosed embodiments may be described, modifications, adaptations, and other implementations are possible. For example, substitutions, additions or modifications may be made to the elements illustrated in the drawings, and the methods described herein may be modified by substituting reordering or adding additional stages or components to the disclosed methods and devices. Accordingly, the following detailed description does not limit the disclosed embodiments. Instead, the proper scope of the disclosed embodiments is defined by the appended claims.

The disclosed embodiments improve upon the prior art by providing an apparatus for attaching a panel mounted electrical component to an external surface in a convenient location to allow a user to quickly and easily access one or more circuit breakers to repair, isolate or manipulate the wiring or electrical devices or appliances on that circuit. In this document, the term electrical component shall refer to a circuit breaker, a switch, a fuse, a distribution board, subsidiary circuit, protective fuse, electrical switch, electrical circuit, arc-fault circuit interrupter, network protector, hybrid switchgear module, or the like.

Figure 1:
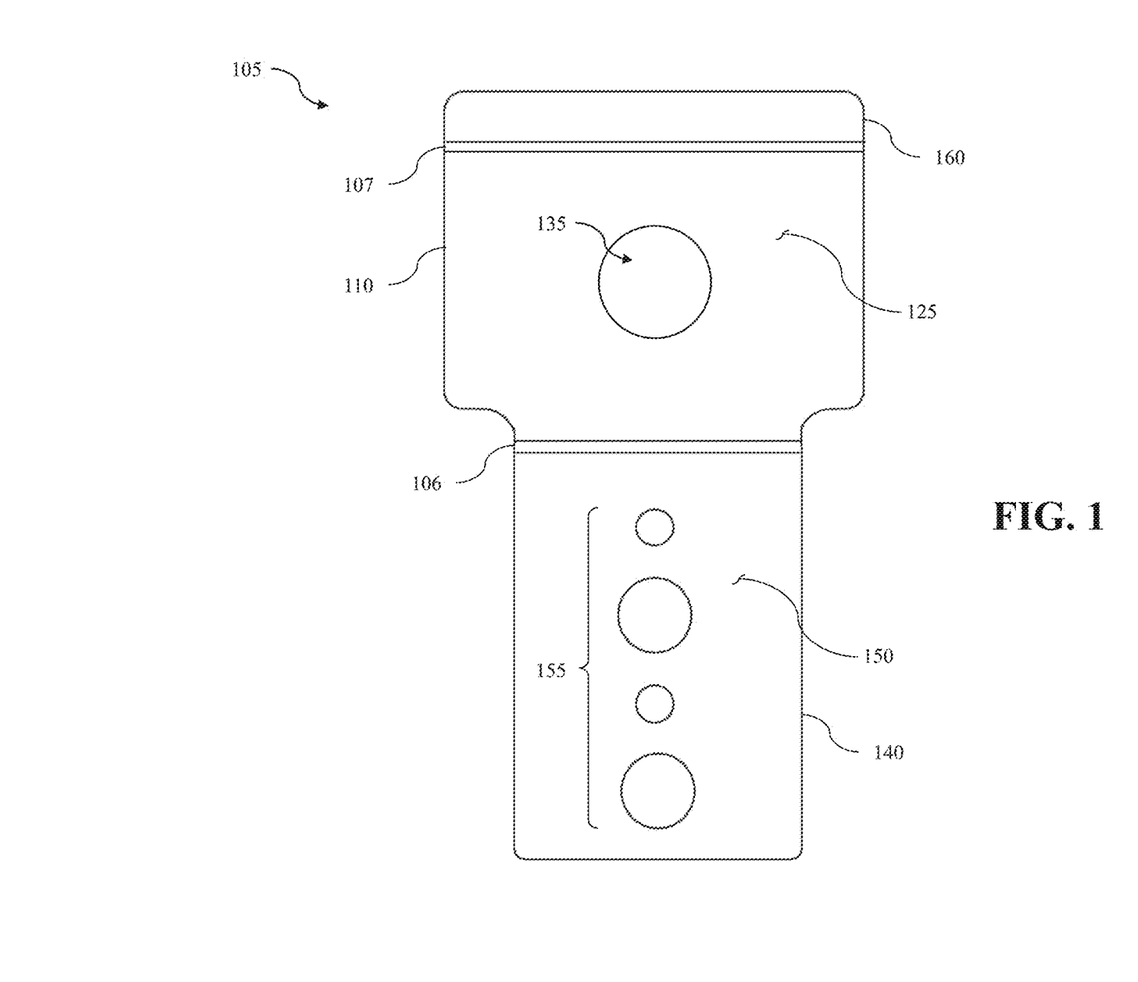
FIG. 1 is a leveled or flattened view of a single mount apparatus for attaching a panel mounted electrical component, according to a first example embodiment.
Figure 2:
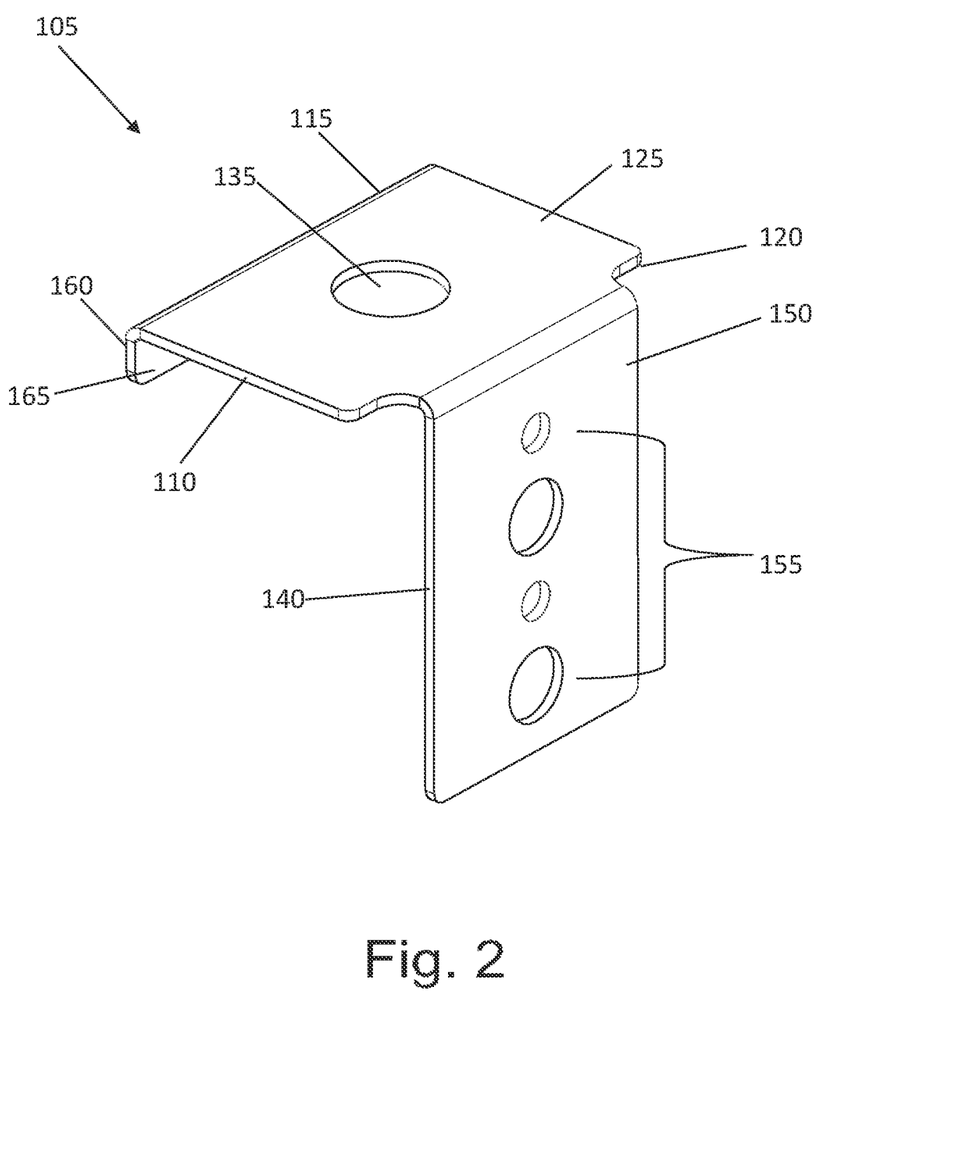
FIG. 2 is a side perspective view of a single mount bracket for attaching a panel mounted electrical component, according to an example embodiment.
Figure 3:
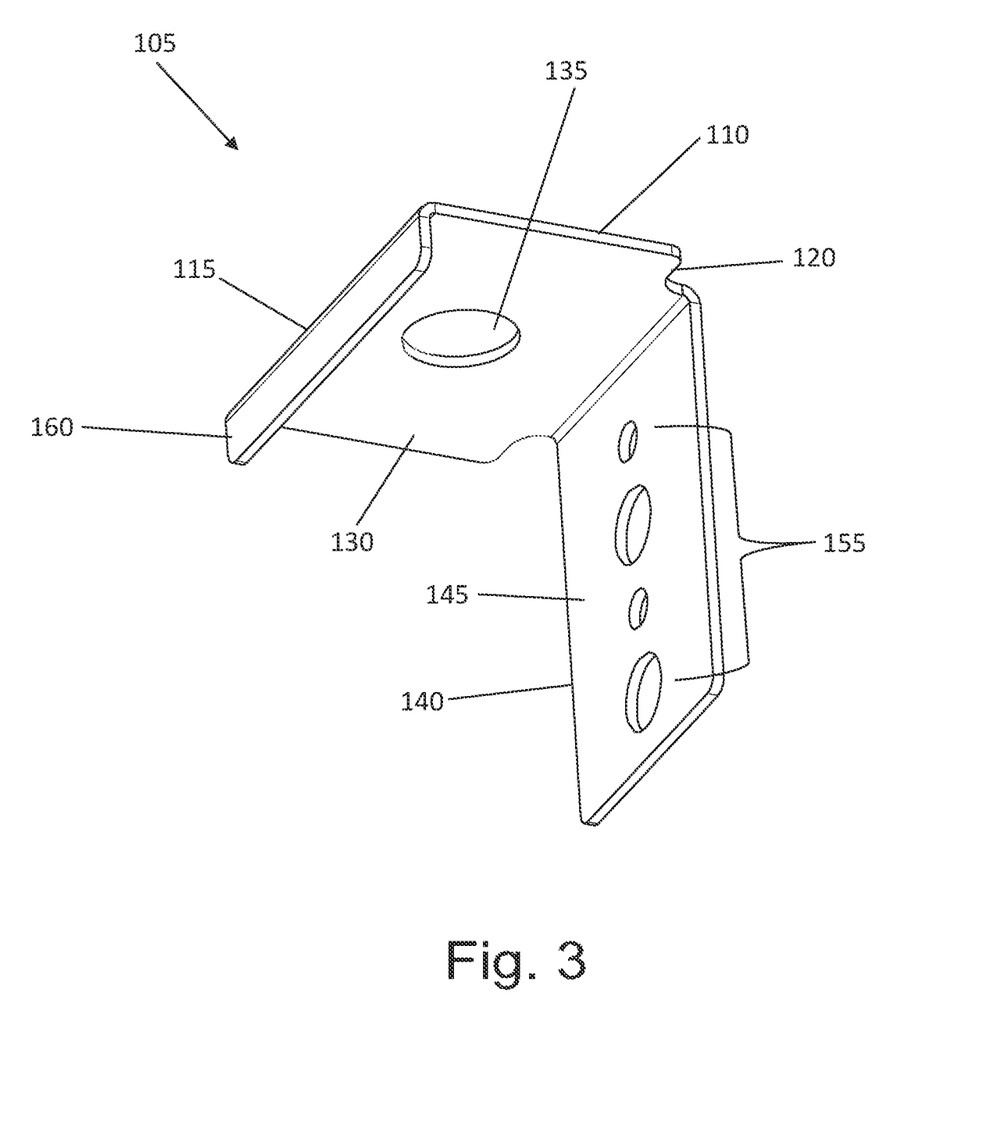
FIG. 3 is a bottom perspective view of a single mount bracket for attaching a panel mounted electrical component, according to an example embodiment.

Referring now to the Figures, FIGS. 1-3 illustrate a single mount apparatus 105 for attaching a panel mounted electrical component to an external surface, according to a first example embodiment and will be discussed together for ease of reference. Recall, however, that FIG. 1 is a leveled or flattened view, wherein the bent apparatus 105 has been flattened or leveled to better describe the apparatus. The apparatus 105 is an L-shaped bracket formed from a single unitary member that is either bent, cast or forged to define a horizontal member 110, a vertical member 140, and a lip 160. As further discussed below, the horizontal member 110 and the vertical member 140 are joined at a first bending-point 106, and the horizontal member 110 and the lip 160 are joined a second bending-point 107. The bracket may be comprised of materials such as metal (including galvanized steel or iron, copper, aluminum, alloys and the like) and plastic (including polybutylene, un-plasticized polyvinylchloride (PVC), chlorinated polyvinylchloride (CPVC) and polyethylene) to increase corrosion resistance to specific environments, enhance oxidation resistance, and impart special characteristics.

The horizontal member 110 has a substantially planar rectangular shaped body with rounded corners and includes a frontward facing edge 115, a rearward facing edge 120, an upward facing surface 125, and a downward facing surface 130. It should be appreciated that the horizontal member may have other shapes and dimensions, and such variations are within the spirit and scope of the claimed embodiments. The horizontal member 110 includes an opening 135 that is configured for receiving a panel mounted electrical component. The opening 135 is located on the center line of the horizontal member 110 and is defined by a circular-shaped hole formed therethrough. In operation, an actuator from a panel mounted electrical component, such as a switch or circuit breaker, projects from the upward facing surface 125 of the horizontal member. It should be appreciated that the horizontal member opening may have other shapes and dimensions, and such variations are within the spirit and scope of the claimed embodiments. The horizontal member opening may be manufactured using a variety of different processes such as punching, stamping, scissoring, flame cutting, laser cutting, sawing, drilling, milling, or turning.

The vertical member 140 is aligned along the rearward facing edge 120 of the horizontal member 110. The vertical member 140 has a substantially planar rectangular shaped body with rounded corners and includes an inward facing surface 145 and an outward facing surface 150. As best shown in FIGS. 2 and 3, the vertical member is integral with the horizontal member 110 and defines a ninety-degree angle between the downward facing surface 130 of the horizontal member 110 and the inward facing surface 145 of the vertical member 140. It should be appreciated that the vertical member may have other shapes and dimensions, and such variations are within the spirit and scope of the claimed embodiments.

The vertical member 140 includes a plurality of openings 155 configured for receiving a plurality of fasteners to attach the outward facing surface 150 of the vertical member 140 to an external surface in a convenient location to allow a user to quickly and easily access a circuit breaker to repair, isolate or manipulate the wiring or electrical devices or appliances on that circuit. The plurality of openings 155 are located on the center line of the vertical member 140 and are defined by circular-shaped holes formed therethrough. It should be appreciated that the plurality of openings 155 on the vertical member may have a variety of cross-sectional shapes and configurations, and such variations are within the spirit and scope of the claimed embodiments. The plurality of openings 155 on the vertical member may be manufactured from a variety of different processes such as punching, stamping, scissoring, flame cutting, laser cutting, sawing, drilling, milling, or turning. The fasteners to attach the outward facing surface 150 of the vertical member 140 to an external surface may include screws, bolts, welds, pins, clamps, brackets, magnets, male-female interference-type connections, cable ties, waterproof adhesives, or any other suitable method known in the art.

The lip 160 is vertically aligned along the frontward facing edge 115 of the horizontal member 110. The lip 160 has a substantially planar rectangular shaped body with rounded corners and includes an inward facing surface 165. The lip is configured to provide additional support and rigidity to the bracket, and protect the panel mounted electrical component. As best shown in FIGS. 2 and 3, the lip is integral with the horizontal member 110 and defines a ninety-degree angle between the downward facing surface 130 of the horizontal member 110 and the inward facing surface 165 of the lip 160. It should be appreciated that the lip may have other shapes and dimensions, and such variations are within the spirit and scope of the claimed embodiments.

Figure 4:
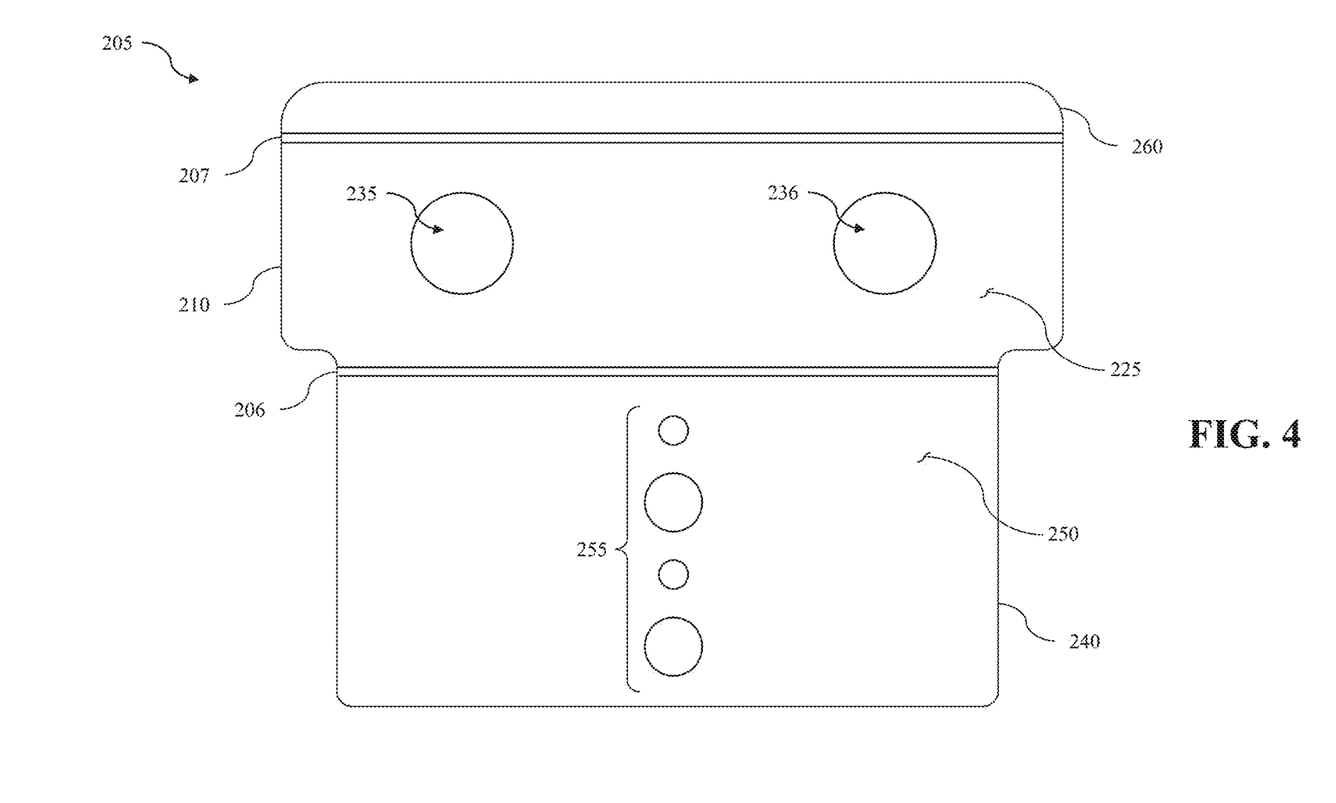
FIG. 4 is a leveled or flattened view of a double mount apparatus for attaching panel mounted electrical components, according to a second example embodiment.
Figure 5:
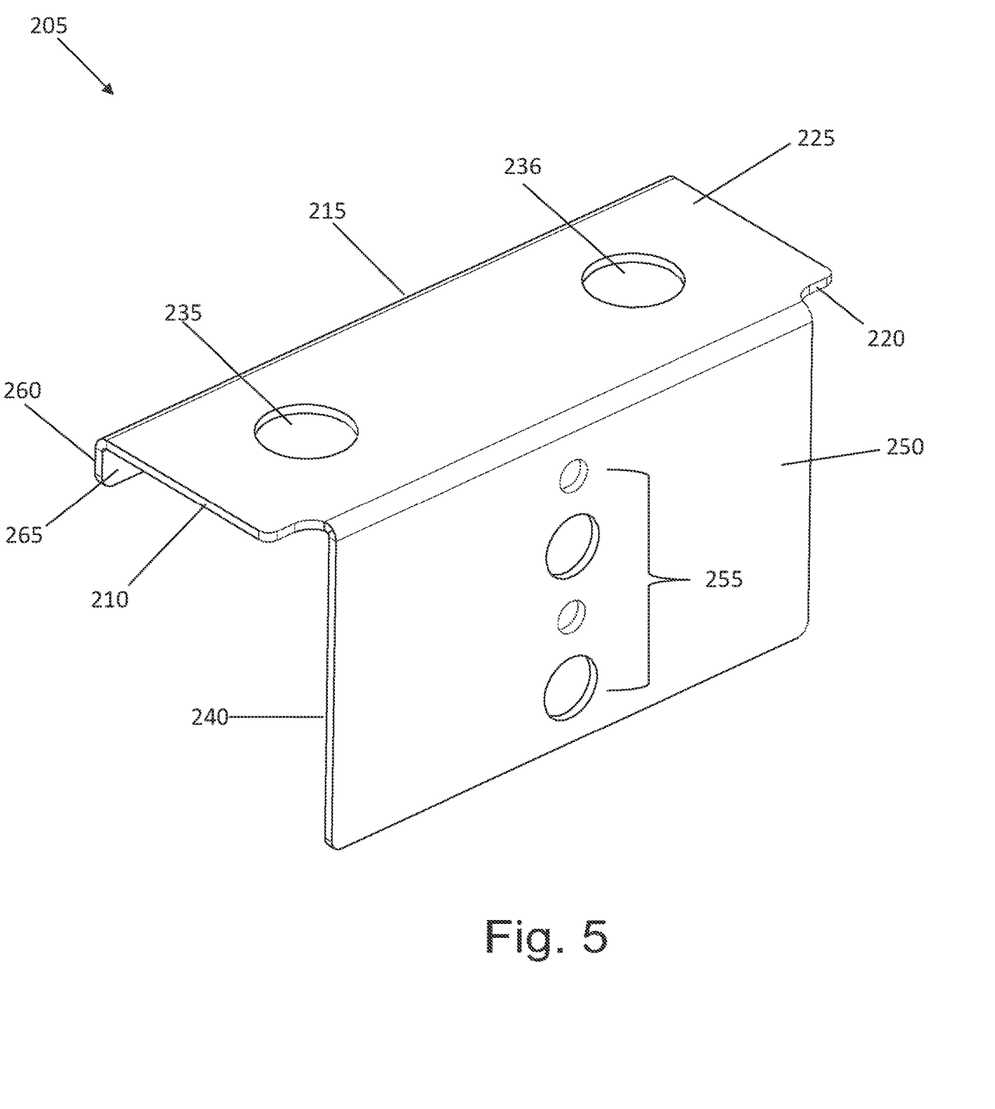
FIG. 5 is a rear perspective view of a double mount apparatus for attaching panel mounted electrical components, according to an example embodiment.
Figure 6:
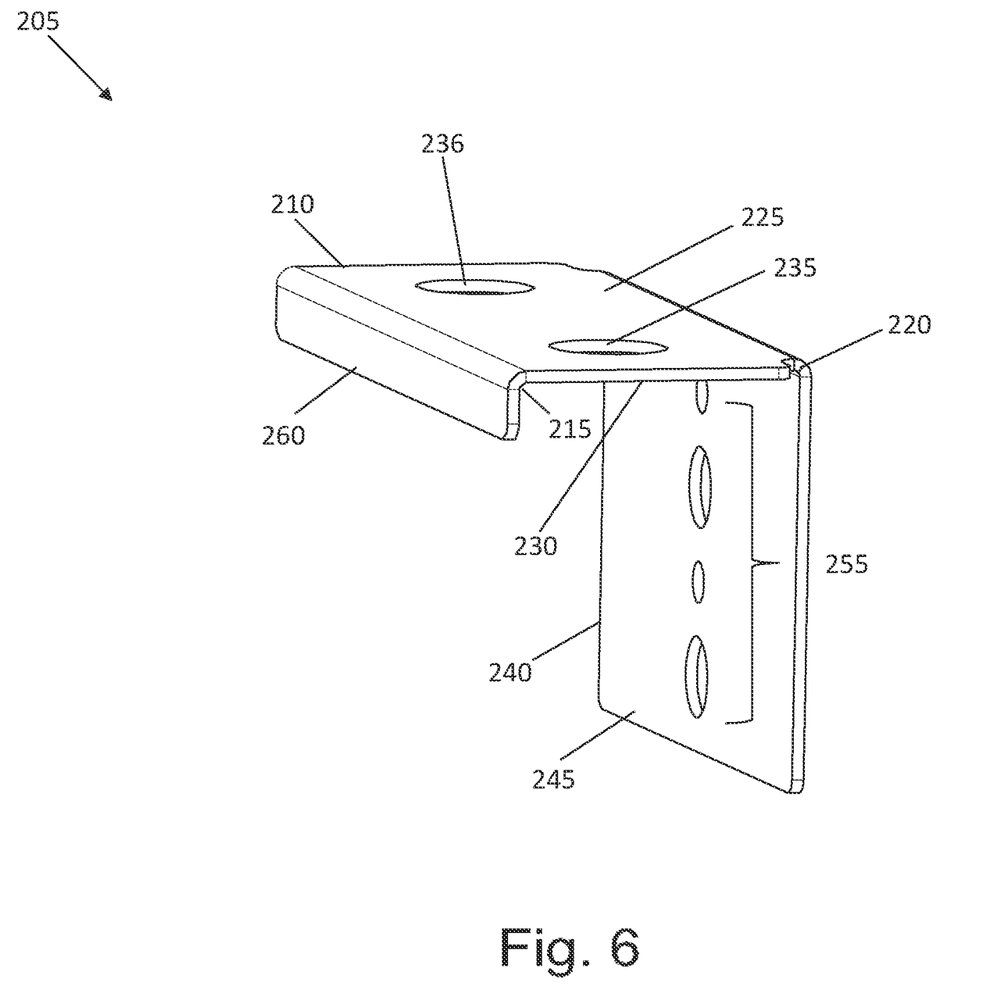
FIG. 6 is a side perspective view of a double mount apparatus for attaching panel mounted electrical components, according to an example embodiment.

FIGS. 4-6 illustrate a double mount apparatus 205 for attaching multiple panel mounted electrical components to an external surface, according to a second example embodiment and will be discussed together for ease of reference. Similar to the apparatus 105 shown in FIGS. 1-3, the apparatus 205 includes an L-shaped bracket formed from a single unitary member that is either bent, cast or forged to define a horizontal member 210, a vertical member 240, and a lip 260. Recall, however, that FIG. 4 is a leveled or flattened view, wherein the bent apparatus 205 has been flattened or leveled to better describe the apparatus. The horizontal member 210 and the vertical member 240 are joined at a first bending-point 206, and the horizontal member 210 and the lip 260 are joined a second bending-point 207.

The horizontal member 210 has a substantially planar rectangular shaped body with rounded corners and includes a frontward facing edge 215, a rearward facing edge 220, an upward facing surface 225, and a downward facing surface 230. The horizontal member 210 includes a first opening 235 for receiving a first panel mounted electrical component and a second opening 236 for receiving a second panel mounted electrical component. The first 235 and second opening 235 are located on the center line of the horizontal member 210 and are defined by a circular-shaped hole formed therethrough. In operation, a pair of actuators from two panel mounted electrical components, such as switches or circuit breakers, project from the upward facing surface 225 of the horizontal member.

The vertical member 240 is aligned along the rearward facing edge 220 of the horizontal member 210. The vertical member 240 has a substantially planar rectangular shaped body with rounded corners and includes an inward facing surface 245 and an outward facing surface 250. As best shown in FIGS. 5 and 6, the vertical member is integral with the horizontal member 210 and defines a ninety-degree angle between the downward facing surface 230 of the horizontal member 210 and the inward facing surface 245 of the vertical member 240.

The vertical member 240 includes a plurality of openings 255 configured for receiving a plurality of fasteners to attach the outward facing surface 250 of the vertical member 240 to an external surface in a convenient location to allow a user to quickly and easily access a circuit breaker to repair, isolate or manipulate the wiring or electrical devices or appliances on that circuit. The plurality of openings 255 are located on the center line of the vertical member 240 and are defined by circular-shaped holes formed therethrough.

The lip 260 is vertically aligned along the frontward facing edge 215 of the horizontal member 210. The lip 260 has a substantially planar rectangular shaped body with rounded corners and includes an inward facing surface 265. As best shown in FIGS. 5 and 6, the lip is integral with the horizontal member 210 and defines a ninety-degree angle between the downward facing surface 230 of the horizontal member 210 and the inward facing surface 265 of the lip 260.

Figure 7:
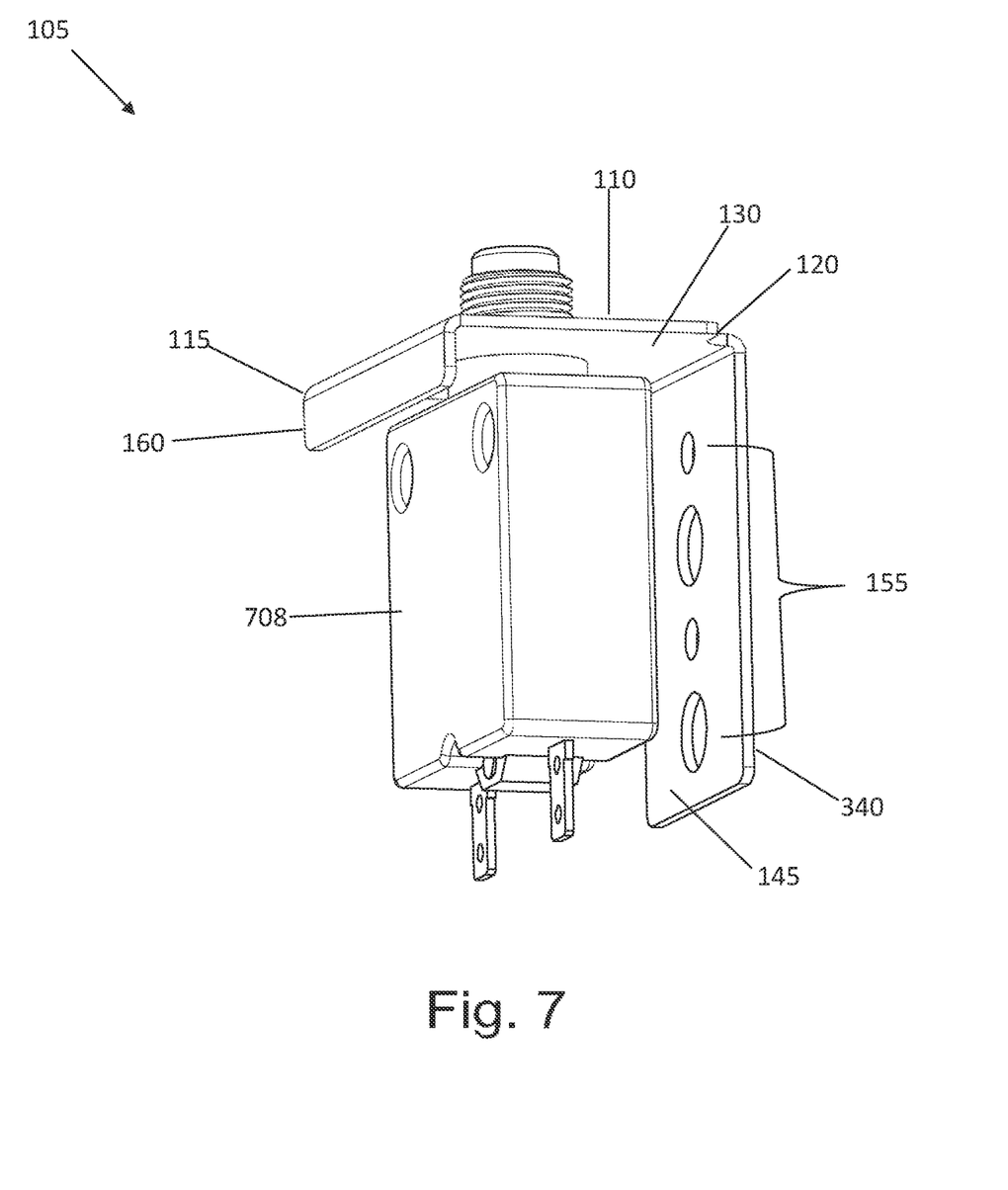
FIG. 7 is a side perspective view of a panel mounted electrical component attached to a single mount bracket, according to an example embodiment.
Figure 8:
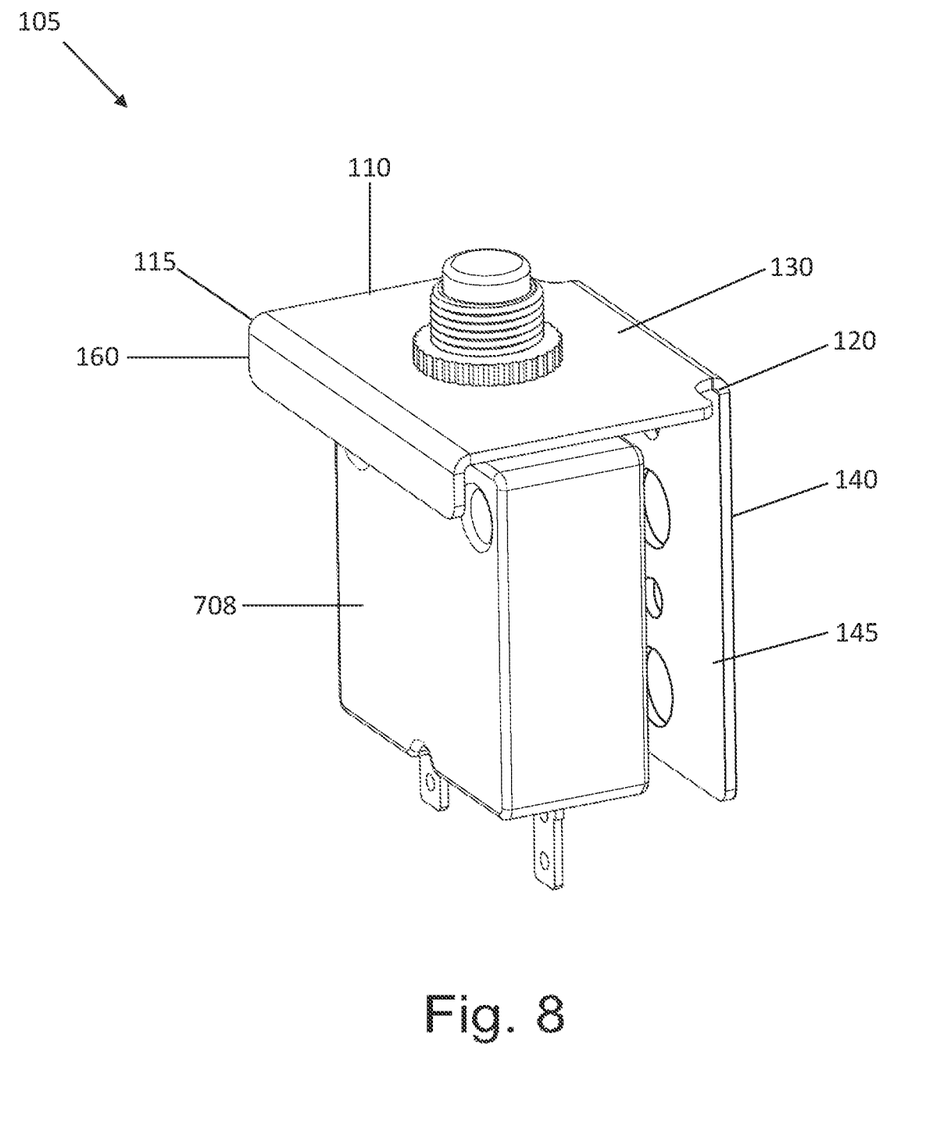
FIG. 8 is a top perspective view of a panel mounted electrical component attached to a single mount bracket, according to an example embodiment.

FIGS. 7 and 8 illustrate a system for attaching a panel mounted electrical component to an external surface, according to a third example embodiment and will be discussed together for ease of reference. FIGS. 7 and 8 include the single mount apparatus 105 described above. The system includes an apparatus 105 for attaching at least one panel mounted electrical component 708. The apparatus 105 includes an L-shaped bracket formed from a single unitary member that is either bent, cast or forged to define a horizontal member 110, a vertical member 140, and a lip 160. The horizontal member 110 and the vertical member 140 are joined at a first bending-point 106, and the horizontal member 110 and the lip 160 are joined a second bending-point 107.

The horizontal member 110 has a substantially planar rectangular shaped body with rounded corners and includes a frontward facing edge 115, a rearward facing edge 120, an upward facing surface 125, and a downward facing surface 130. The horizontal member 110 includes an opening 135 that is configured for receiving a panel mounted electrical component. The opening 135 is located on the center line of the horizontal member 110 and is defined by a circular-shaped hole formed therethrough.

Figure 9:
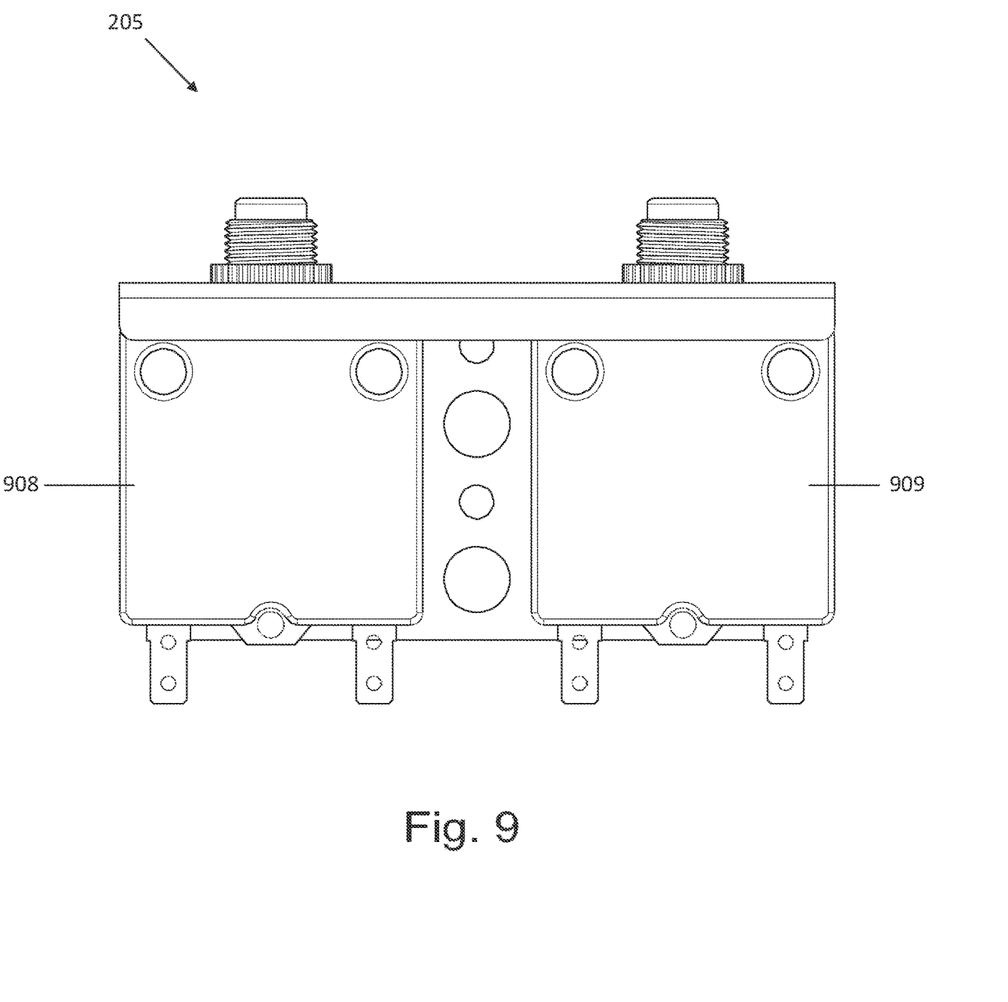
FIG. 9 is a front perspective view of two panel mounted electrical components attached to a double mount bracket, according to an example embodiment.
Figure 10:
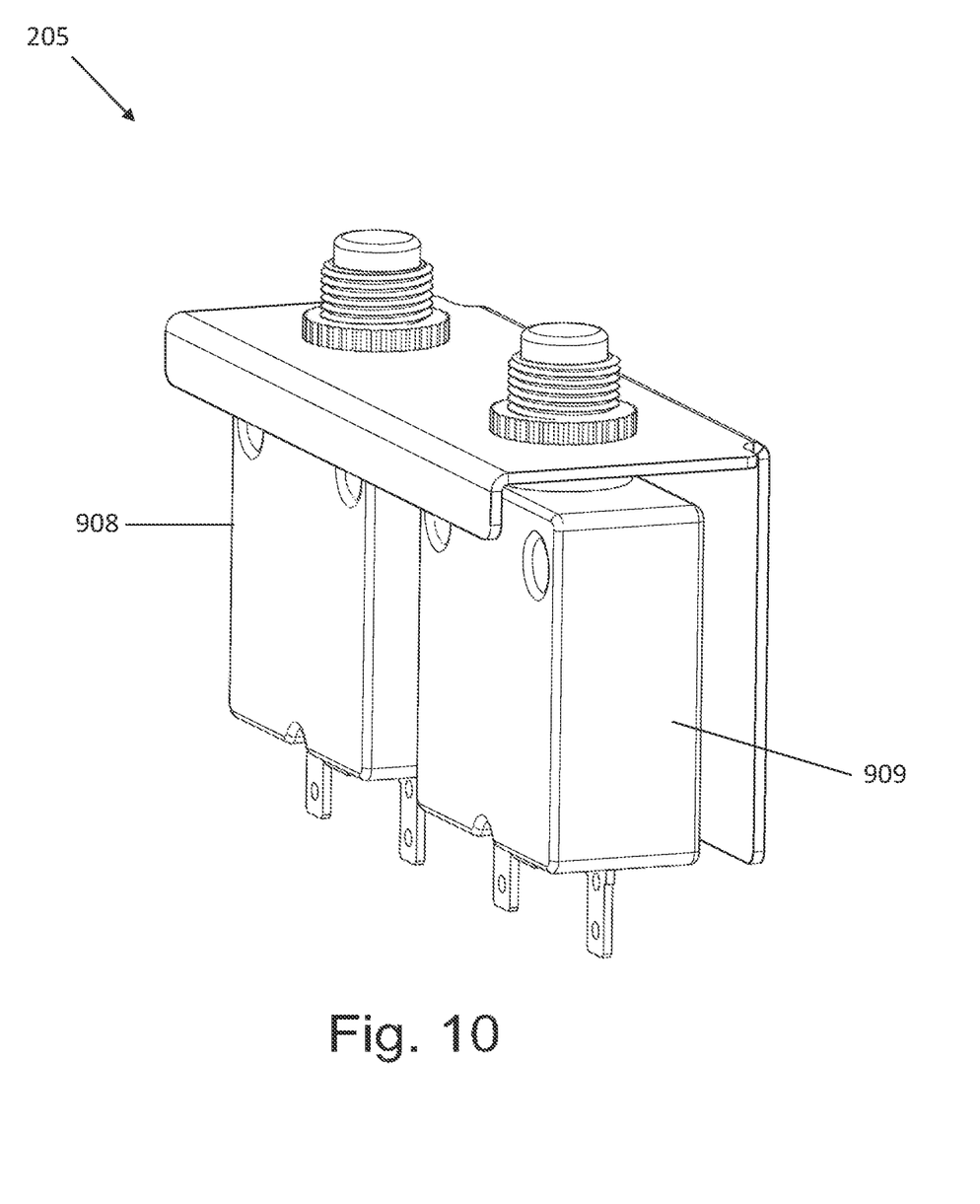
FIG. 10 is a side perspective view of two panel mounted electrical components attached to a double mount bracket, according to an example embodiment.

FIGS. 9 and 10 include the double mount apparatus 205 described above, configure for attaching at two panel mounted electrical components 908, 909. The apparatus 205 includes an L-shaped bracket formed from a single unitary member that is either bent, cast or forged to define a horizontal member 210, a vertical member 240, and a lip 260. The horizontal member 210 and the vertical member 240 are joined at a first bending-point 206, and the horizontal member 210 and the lip 260 are joined a second bending-point 107. The electrical components 908, 909 are inserted into, and secured to, openings 235, 236, respectively.

The vertical member 240 includes a plurality of openings 255 configured for receiving a plurality of fasteners to attach the outward facing surface 250 of the vertical member 240 to an external surface in a convenient location to allow a user to quickly and easily access a circuit breaker to repair, isolate or manipulate the wiring or electrical devices or appliances on that circuit. The plurality of openings 255 are located on the center line of the vertical member 240 and are defined by circular-shaped holes formed therethrough.

The system further includes at least one panel mounted electrical component. In one embodiment, the panel mounted electrical component is a push button thermal circuit breaker that is interconnected with a primary power source such as utility power. It should be appreciated that the panel mounted electrical component may include a switch member or handle that is movable between an ON position and an OFF position, and such variations are within the spirit and scope of the claimed embodiments.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

I claim:

1. An apparatus for attaching a panel mounted electrical component comprising:
an L-shaped bracket comprising:

a horizontal member having a frontward facing edge and a rearward facing edge, wherein the horizontal member has a midpoint;

a first opening on the horizontal member for receiving a first panel mounted electrical component, said first opening located on a left side of the midpoint;

a second opening on the horizontal member for receiving a second panel mounted electrical component, said second opening located on a right side of the midpoint;

a vertical member aligned along the rearward facing edge of the horizontal member, wherein the vertical member is integral with the horizontal member and defines a ninety-degree angle, wherein the vertical member has a width that is less than a width of the horizontal member, and wherein the vertical member has a vertical centerline that bisects the vertical member into two equal portions; and at least four openings located on the vertical member along the vertical centerline, the at least four openings for receiving fasteners to attach an outward facing surface of the vertical member to a surface, wherein the at least four openings comprise two circular openings of a first size and two circular openings of a second size smaller than the first size; and a lip vertically aligned along the frontward facing edge of the horizontal member, wherein the lip is integral with the horizontal member and defines a ninety-degree angle.

2. The apparatus of claim 1, wherein the bracket is formed from a single unitary member.

3. The apparatus of claim 1, wherein the horizontal member includes an upward facing surface and a downward facing surface.

4. The apparatus of claim 1, wherein the lip is configured to provide additional support and rigidity to the bracket.

5. An apparatus for attaching panel mounted electrical components comprising:

an L-shaped bracket comprising:

a horizontal member having a frontward facing edge and a rearward facing edge, wherein the horizontal member has a midpoint;

a first opening on the horizontal member for receiving a first panel mounted electrical component, said first opening located on a left side of the midpoint;

a second opening on the horizontal member for receiving a second panel mounted electrical component, said second opening located on a right side of the midpoint;

a vertical member aligned along the rearward facing edge of the horizontal member, wherein the vertical member is integral with the horizontal member and defines a ninety-degree angle, wherein the vertical member has a width that is less than a width of the horizontal member, and wherein the vertical member has a vertical centerline that bisects the vertical member into two equal portions;

at least four openings located on the vertical member along the vertical centerline, the at least four openings for receiving fasteners to attach an outward facing surface of the vertical member to a surface, wherein the at least four openings comprise two circular openings of a first size and two circular openings of a second size smaller than the first size; and a lip vertically aligned along the frontward facing edge of the horizontal member, wherein the lip is integral with the horizontal member and defines a ninety-degree angle, and wherein the lip has a width that is equal to the width of the horizontal member.

6. The apparatus of claim 5, wherein the bracket is formed from a single unitary member.

7. The apparatus of claim 5, wherein the horizontal member includes an upward facing surface and a downward facing surface.

8. The apparatus of claim 5, wherein the lip is configured to provide additional support and rigidity to the bracket.

* * * * *